(12) United States Patent
Bancel et al.

(10) Patent No.: US 7,921,342 B2
(45) Date of Patent: Apr. 5, 2011

(54) INTEGRATED CIRCUIT COMPRISING A TEST MODE SECURED BY THE USE OF AN IDENTIFIER, AND ASSOCIATED METHOD

(75) Inventors: Frédéric Bancel, Lamanon (FR); David Hely, Marseilles (FR)

(73) Assignee: STMicroelectronics SA, Montrouge (FR)

( * ) Notice: Subject to any disclaimer, the term of this patent is extended or adjusted under 35 U.S.C. 154(b) by 1085 days.

(21) Appl. No.: 11/675,265

(22) Filed: Feb. 15, 2007

(65) Prior Publication Data

US 2007/0257701 A1    Nov. 8, 2007

(30) Foreign Application Priority Data

Feb. 15, 2006   (FR) ...................... 06 01304

(51) Int. Cl.
    *G01R 31/28* (2006.01)
(52) U.S. Cl. ...................... 714/724; 714/726
(58) Field of Classification Search .................. 714/724, 714/726, 732; 713/189, 194; 726/22
    See application file for complete search history.

(56) References Cited

U.S. PATENT DOCUMENTS

| | | | | |
|---|---|---|---|---|
| 5,574,733 | A * | 11/1996 | Kim ........................ | 714/728 |
| 5,708,715 | A * | 1/1998 | Vicard ...................... | 713/191 |
| 6,158,033 | A * | 12/2000 | Wagner et al. ............ | 714/726 |
| 6,294,816 | B1 * | 9/2001 | Baukus et al. ............ | 257/368 |
| 6,457,145 | B1 * | 9/2002 | Holmberg et al. ......... | 714/45 |
| 6,611,929 | B1 * | 8/2003 | Barnes ..................... | 714/718 |
| 7,106,091 | B2 * | 9/2006 | Gammel ................... | 326/8 |
| 7,178,039 | B2 * | 2/2007 | Mueller .................... | 713/193 |
| 7,725,786 | B2 * | 5/2010 | Bancel et al. ............. | 714/724 |
| 2007/0005993 | A1 * | 1/2007 | Jacobs ...................... | 713/300 |
| 2008/0148118 | A1 * | 6/2008 | Morgan et al. ............ | 714/726 |

FOREIGN PATENT DOCUMENTS

EP         196152 A2 * 10/1986

OTHER PUBLICATIONS

"Dynamically configurable security for SRAM FPGA bitstreams" by Bossuet et al. This paper appears in: Parallel and Distributed Processing Symposium, 2004. Proceedings. 18th International Publication Date: Apr. 26-30, 2004.*

"High-Performance Software Protection Using Reconfigurable Architectures" by Zambreno et al. This paper appears in: Proceedings of the IEEE Publication Date: Feb. 2006 vol. 94, Issue: 2 on pp. 419-431.*

"Secure Content Distribution System Based on Run-Time Partial Hardware Reconfiguration" by Yohei Hori et al. This paper appears in: Field Programmable Logic and Applications, 2006. FPL '06. International Conference on Publication Date: Aug. 2006 on pp. 1-4.*

* cited by examiner

*Primary Examiner* — Cynthia Britt
(74) *Attorney, Agent, or Firm* — Lisa K. Jorgenson; Allen, Dyer, Doppelt, Milbrath & Gilchrist, P.A.

(57) ABSTRACT

An electronic circuit includes configurable cells capable of being functionally linked to logic cells with which they cooperate to form at least one logic circuit if a chaining command signal is in a first (inactive) state. The electronic circuit also includes a logic interconnection circuit for performing the following functions if the chaining command signal is in a second (active) state. Functionally connecting the configurable cells in a linear feedback shift register if an authentication signal is in a first state, or functionally connecting the configurable cells in a chain in a predefined order to form a shift register if the authentication signal is in a second state.

22 Claims, 3 Drawing Sheets

INTEGRATED CIRCUIT COMPRISING A TEST MODE SECURED BY THE USE OF AN IDENTIFIER, AND ASSOCIATED METHOD

FIELD OF THE INVENTION

The invention generally relates to synchronous electronic integrated circuits provided with a combination of logic circuits, latches and testing features. More specifically, the invention relates to an electronic circuit comprising a plurality of configurable cells operably configured in a functional state in which they are functionally linked to logic cells with which they cooperate to form at least one logic circuit if a chaining command signal is in a first state, or operably configured in a chained state in which the configurable cells are functionally connected in a chain to form a shift register.

BACKGROUND OF THE INVENTION

There are well-known ways of testing for the proper operation of the functional elements of an integrated circuit. This is done by the imposition and/or determination at predefined instants of data values present at certain internal points of the integrated circuit. Such a technique of testing the internal paths of an integrated circuit, known as a scan path or an internal scan method, is described for example in "Enhancing Testability of LSI Circuits Via Test Points and Additional Logic, by M. Williams and J. Angel, IEEE Transactions on Computers, vol. C-22, No. 1, January 1973.

According to this technique, each of the latches of the logic circuit, whose state needs to be known and/or for which it is necessary to impose the content during the standard operation of the integrated circuit, is provided at its input with a multiplexer. The different latches and the multiplexers that are associated with these latches thus constitute an equivalent number of configurable cells whose access ports are individually controlled by the multiplexers.

The multiplexers of the different configurable cells are collectively controlled by an access controller or TAP (Test Access Port) controller which, depending on a control signal defining a chosen mode of operation, uses this set of configurable cells either as a standard functional circuit integrated into the logic circuit that it forms with the logic cells, or as a test circuit.

To do this, the TAP controller receives and/or addresses control signals on various control conductors by which it is connected to the different configurable cells. The control signals are, for example, a chaining control signal or a data propagation control signal. They authorize the modification and/or modify the paths of the circulation of data within the integrated circuit. This enables the capture of the data by the controller for their subsequent analysis.

In the standard mode of operation, the TAP controller therefore drives the multiplexers of the configurable cells in such a way that the latches of these cells are connected to surrounding logic cells to define one or more functional subsets of the integrated circuit.

In the test mode, which is normally activated upon reception by the TAP controller of a control signal for passage into the test mode, the controller produces a chaining control signal for the series connection of the latches of the configurable cells so as to form a shift register. This register comprises especially a serial input and a serial output respectively connected to an output and to an input of the TAP controller. The register also comprises a clock input for receiving a clock signal to set the pace of the flow of data circulating in the shift register.

In a first step, the TAP controller serially loads data into the latches of the configurable cells through the input of the shift register formed by these configurable cells. Then, the TAP controller changes the selection switching of the multiplexers to form the functional circuit and orders the execution of one or more cycles of the propagation signal by this functional circuit. In this phase, the data loaded into the latches of the configurable cells are processed by the functional circuit.

The controller then once again changes the selection switching of the multiplexers to again form the shift register and, at the output of the shift register, it serially retrieves the data stored in the latches of the configurable cells during the last cycle of the propagation signal. Despite the confirmed utility of this testing technique, its practical application may prove to be problematic in certain circumstances, especially in integrated circuits that process secret data.

Indeed, inasmuch as the activation of the test mode may enable a fraudulent individual to read the content of the latches of the configurable cells, this testing technique has the drawback of making such circuits highly vulnerable to fraudulent use. For example, by stopping a process of internal loading of secret data into the integrated circuit at various points in time and by unloading the contents of the shift register, a fraudulent person could obtain information on secret data, and even reconstruct this data.

By activating the test mode, a fraudulent individual could also obtain write access to the latches of the configurable cells to insert fraudulent data, or else place the integrated circuit in an unauthorized configuration. The fraudulent individual could thus, for example, access a register controlling a security element such as a sensor in order to deactivate it. Erroneous data could also be inserted to obtain information on secret data.

The fraudulent individual may in fact adopt two different strategies. The first strategy includes taking control of the TAP controller, and observing the contents of the cells of the shift register at the external pads. The second strategy includes taking control of the configurable cells by exciting them by micro-probing so as to simulate the driving of these cells by the command signals emitted by the TAP controller.

French application no. FR 05/07282 describes an electronic circuit designed to thwart an attempt at fraud. In '282 application, after entry into the test mode, an identifier of the user has to be input. If the identifier is correct, test data may be entered into the shift register. If not, an alert is activated and the circuit exits from the test mode. To this end, the electronic circuit comprises a detection circuit complementing the elements described above. This detection circuit is designed for the verification, if the chaining command signal is active, of the content of the shift register at the end of the period of time T1 needed for the input of the identifier into the register.

According to the approach disclosed by the '282 application, the identifier has to be entered at each activation of the chaining command signal before data can be input into the shift register or output from this shift register. This soon becomes a constraint for test procedures of varying length during which the data has to be input or output several times. Furthermore, due to this difficulty, relatively short identifiers are used. They are faster to input into the register but also easier to find for a fraudulent person. Finally, since the identifier is input when the configurable cells are chained, the input of the identifier leads to the output of the initial content of the register which, as the case may be, may include the data to be protected from a fraudulent individual.

SUMMARY OF THE INVENTION

In view of the foregoing background, an object of the invention is to provide an electronic circuit that protects against attacks but does not have the drawbacks of prior art circuits.

The electronic circuit in accordance with the present invention comprises a plurality of configurable cells capable of being functionally linked to logic cells with which they cooperate to form at least one logic circuit if the chaining command signal is in a first state.

The electronic circuit may further comprise an interconnection circuit comprising a plurality of connection cells each comprising a first data input connected to a data output of a first configurable cell, one data output connected to a test input of a second configurable cell of a rank higher than the rank of the first configurable cell, a second data input connected to the data output of the second configurable cell or to the data output of a third configurable cell having a rank higher than a rank of the second configurable cell, and a combination and connection means or circuit.

The combination and connection circuit may be adapted to perform the following functions if the chaining command signal is in a second state. Combining the first data input of the connection cell with the second data input of the connection cell, and applying the result of the combination to the output of the connection cell if an authentication signal is in a first state. Or, connecting the first data input of the connection cell to the output of the connection cell if the authentication signal is in a second state.

Thus, when the authentication signal is in the first state, the combination and connection circuit may functionally connect the configurable cells in a linear feedback shift register and, when the authentication signal is in the second state, the combination and connection circuit may functionally connect the configurable cells in a chain in a predefined order to form a test shift register.

Thus, in the electronic circuit, there is provided the possibility of configuring the configurable cells in a looped state in which the cells form a register containing a feedback element or an LFSR (linear feedback shift register). In such a linear feedback shift register, it is possible to input data such as an identifier. The data output from this linear feedback shift register, on the contrary, may not be exploited by a fraudulent person because, in this looped state, as shall be seen more clearly below, the contents of the configurable elements may be modified as and when the data is loaded into the configurable cells.

The electronic circuit may further comprise a detection circuit laid out so that, if the chaining control signal is in the first state during a first period of time T1, it activates the authentication signal if the content of a set of X1 configurable cells corresponds to a first reference value.

To test circuit may perform the following steps when the chaining command circuit is in the second state and the authentication signal is in the first state. Inputting an identifier into the configurable cells functionally forming the linear feedback shift register, verifying a content of the configurable cells, and at the end of a predefined period of time T1, activating the authentication signal if the content is equal to an expected value.

Preferably, a prior step may also be performed for the resetting of the content of the configurable cells. Thus, in the electronic circuit, at the first passage into the test mode (activation of the chaining command signal), the circuit first of all passes into an authentication mode in which the configurable cells are connected by the interconnection cells to form a linear feedback shift register and in which the authorized user may serially input bits of an identifier. Then, after verification of the identifier, the authentication signal is activated and the electronic circuit truly passes into the test mode in which the configurable cells are functionally connected in a chain and form a shift register.

The authentication signal may remain active even if the chaining command signal changes state one or more times. Thus, when the chaining command signal changes state, there is a direct passage from the functional state to the chained state (or the reverse) without again going through the looped state. It is therefore no longer necessary to input the identifier routinely before the input (or output) of each piece of data into the shift register.

BRIEF DESCRIPTION OF THE DRAWINGS

The invention will be understood more clearly and other features and advantages shall appear from the following description of examples of implementation of an electronic circuit according to the invention. The description, given by way of an indication that in no way restricts the scope of the invention, is made with reference to the appended drawings of which.

DETAILED DESCRIPTION OF THE PREFERRED EMBODIMENTS

The electronic circuit is provided with internal test means or features. An electronic circuit of this kind typically comprises a plurality of logic cells such as the cells 10 to 15, a plurality of configurable cells such as the cells $2a$, $2b$, ... $2x$, $2y$, $2z$.

The electronic circuit may comprise a control circuit such as a CTAP access controller which, however, can also be external to the electronic circuit. The controller has, for example, the function of sending or receiving control signals such as a signal to control passage into the test mode TEST_MODE which activates the control circuit CTAP which activates the test input of the configurable cells, a reset signal RESET which resets the contents of the configurable cells, and a control signal CLK which enables the propagation of data in the configurable cells.

The electronic circuit also has a logic interconnection circuit 200, and a detection device 300. Each of the configurable cells $2a$ to $2z$ comprises one data input connected to certain of the logic cells 10 to 15, and one test input connected to the output of a preceding configurable cell or to an output of the interconnection circuit 200. One data output is connected first to certain of the logic cells 10 to 15 and, secondly, to the test input of a following configurable cell or to an input of the circuit 200. Each configurable cell further comprises one clock input to which the propagation signal CLK is applied, one command input to which the chaining command signal SCAN_ENABLE is applied, and one reset input to which the reset signal RESET is applied.

Figure 1:
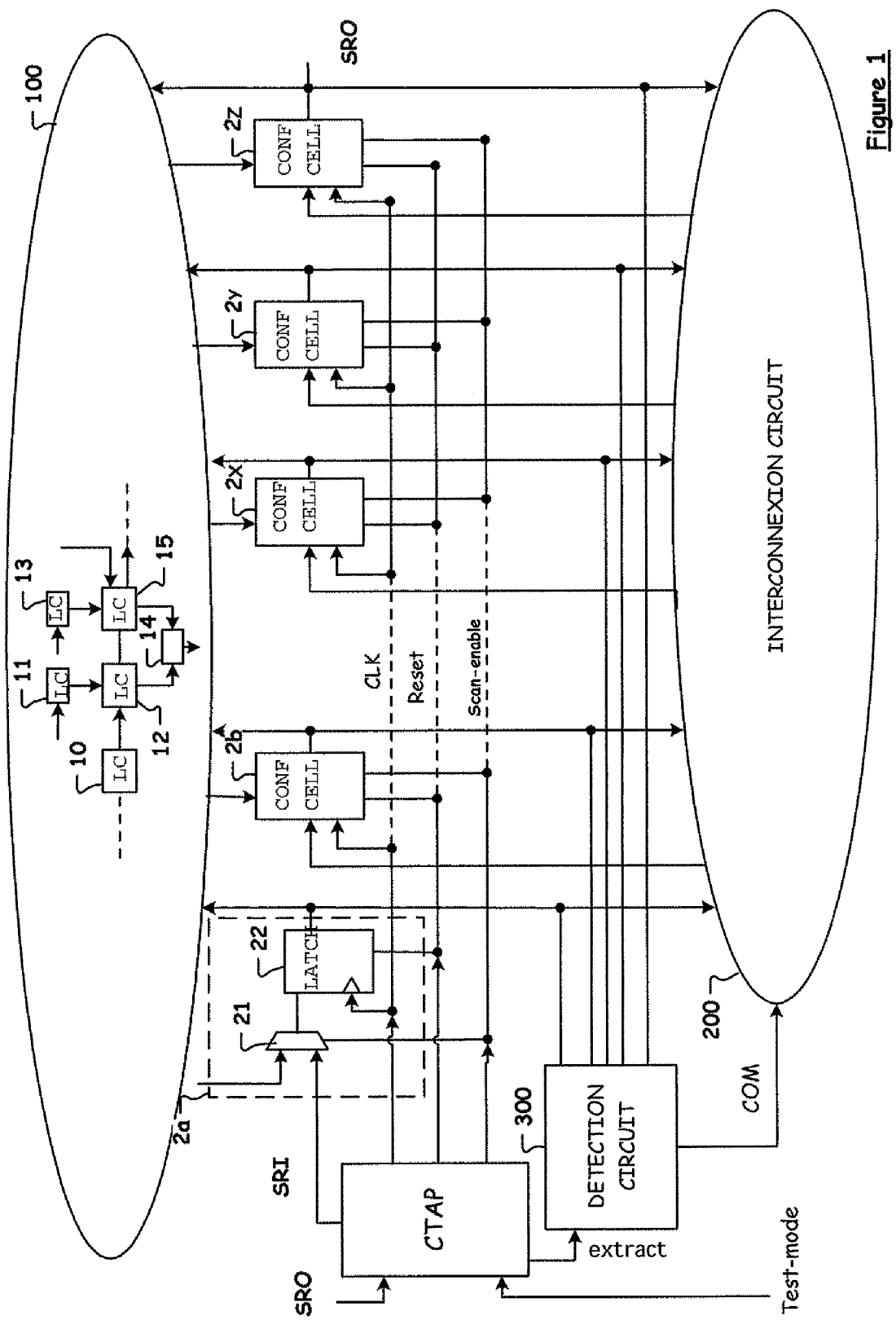
FIG. 1 is a drawing of the circuit according to the invention.

Each of the configurable cells $2a$ to $2z$ also has a multiplexer 21 and a latch circuit 22 (for the sake of clarity, only the cell $2a$ is described in detail in FIG. 1). The multiplexer 21 has two data inputs connected respectively to the data input and the test input of the configurable cell, one control input connected to the control input of the configurable cell to receive the signal SCAN_ENABLE, and one output. The latch circuit 22 has a data input D connected to the output of the multiplexer 21, one clock input, one reset input and one output connected respectively to the clock input, the reset input and the data output of the configurable cell.

When the signal SCAN_ENABLE is in a first logic state (inactive), the multiplexer 21 of each configurable cell is configured so that the data input of the cell is inactive, i.e., so that so that the data input of the cell is connected to the data input of the latch 22. In this case, the configurable cells 2a to 2z adopt a standard mode of operation in which they are functionally connected (by way of their data input and a data output) to at least some of the logic cells 10 to 15 with which they cooperate to form a logic circuit 100.

When the signal SCAN_ENABLE is in a second logic state (active), the multiplexer 21 of each configurable cell is configured so that the test input of the cell is active, i.e., so that the test input of the cell is connected to the data input of the latch circuit 22.

The logic interconnection circuit 200 has data inputs connected to the data output of the configurable cells, and data outputs connected to test inputs of the configurable cells. It also comprises a control input to which the authentication signal COM is applied.

If the authentication signal COM is in a first inactive state, then the interconnection circuit connects the configurable cells to functionally form a linear feedback shift register. The circuit is in an intermediate mode of operation between the standard mode of operation and the test mode.

If the authentication signal is in a second (active) state, then the interconnection circuit connects the configurable cells functionally in a chain to form a shift register. The circuit is then truly in the test mode.

In the test mode, the shift register 2a to 2z especially has a data input SRI driven by an output of the control circuit CTAP, a data output SRO connected to an input of the control circuit CTAP, and a clock input to receive the propagation signal CLK capable of setting the pace of the data flow in this shift register.

Figure 2:
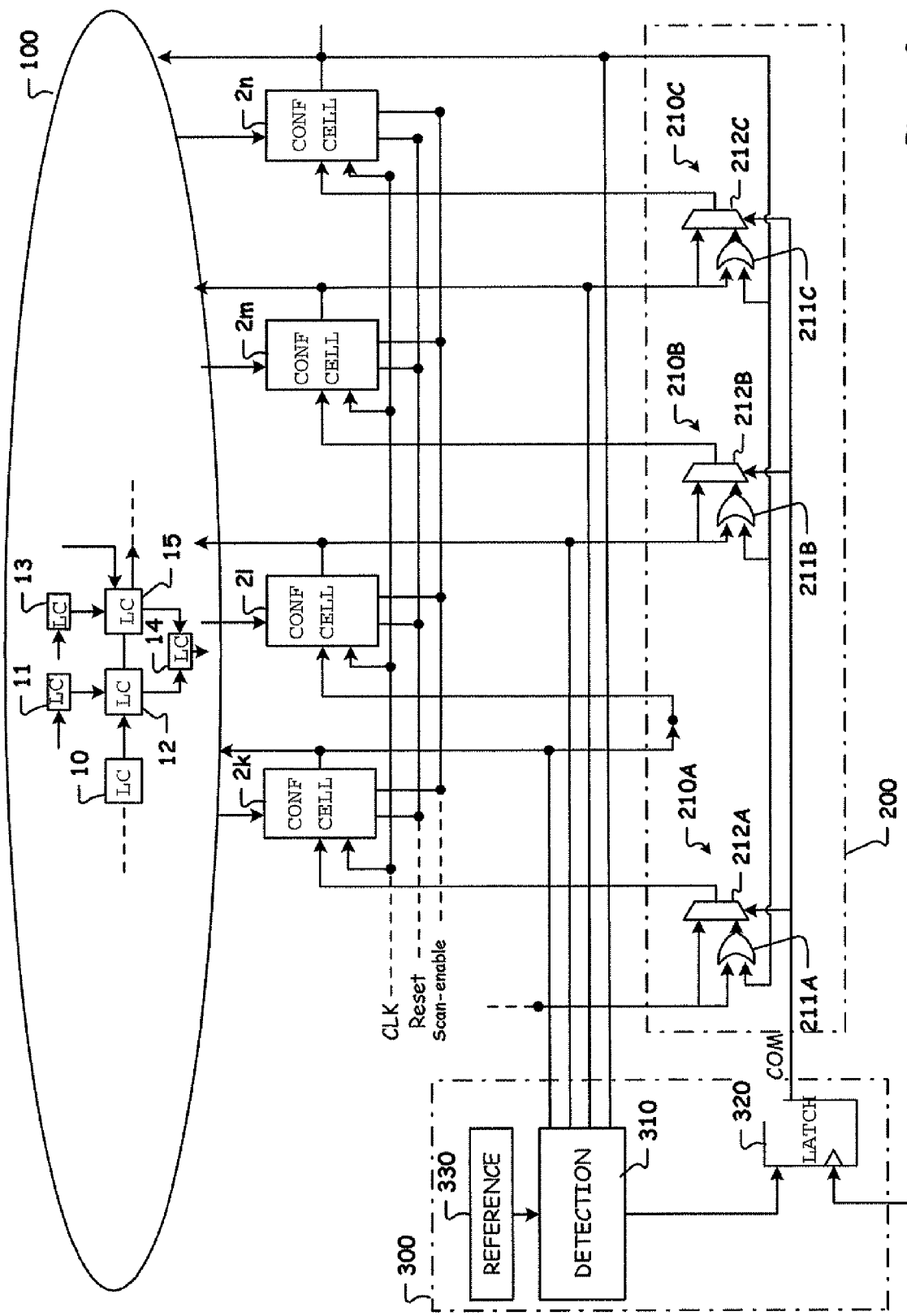
FIG. 2 is a more detailed drawing of the elements shown in FIG. 1.

FIG. 2 in particular provides a detailed view of the embodiments of the logic interconnection circuit 200 and of the detection circuit 300. The interconnection circuit has the function of connecting the configurable cells appropriately to form a linear feedback shift register if the authentication signal COM is in a first (inactive) state, or chaining the configurable cells to form a shift register if the authentication signal COM is in a second (active) state.

In the particular exemplary embodiment of FIG. 2, the logic interconnection circuit 200 is suited to the following when the signal COM is active: associating a part of the configurable cells (in the example, the cells 2k, 2l, 2m and 2n) in the form of a feedback device with X1 bits (in the example, X1=4 bits), one data input of which is connected to the data output of the preceding cell 2j and the data output of which is connected to the test input of the following cell 2o, chaining the configurable cells 2a to 2j, and chaining the configurable cells 2o to 2z. The set of configurable cells thus associated forms a linear feedback shift register.

The interconnection circuit (200) comprises a plurality of connection cells (210a, 210b, 210c) each comprising a first data input connected to a data output of a first configurable cell, one data output connected to a test input of a second configurable cell of a rank higher than the rank of the first configurable cell, and a second data input connected to the data output of the second configurable cell or to the data output of a third configurable cell having a rank higher than a rank of the second configurable cell.

Each connection cell further comprises a combination and connection circuit to combine the first data input of the connection cell with the second data input of the connection cell, and apply the result of the combination to the output of the connection cell if the authentication signal is in the first state, or connect the first data input of the connection cell to the output of the connection cell if the authentication signal is in the second state.

The combination and connection circuit includes the following in the example of FIG. 2. A logic gate 211a, 211b or 211c, in this case of the XOR type comprising two inputs connected respectively to the first data input and to the second data input of the connection cell, and a multiplexer 212a, 212b or 212c comprising two inputs connected respectively to the first data input and to an output of the logic gate. The data output of the cell 2k is directly connected to the data input of the cells 2l.

When the signal CON is inactive (before authentication), the second inputs of the multiplexers 212a, 212b, 212c are selected. The output of the cell 2n is thus in a loop with the inputs of the preceding cells 2k, 2m, 2n by way of the gates 211a, 211b, 211c to form a loop device or LFSR (Linear Feedback Shift Register).

LFSR-type registers are well known. They are commonly used for example to perform polynomial division operations to encipher or decipher an input message or else to generate pseudo-random numbers. They are always made according to the principle of the drawings of FIG. 2. The output of the last cell of the register is re-injected into the input of one or more cells of the register in combination with the output of a preceding cell by means of a logic gate. The position of the interconnection cells (logic gate) depends on the polynomial implemented by the loop device (for example, in the case of FIG. 2, the polynomial $x^3+x+1$ is implemented).

When the signal COM is active (after authentication), the first inputs of the multiplexers are directly connected to the outputs of the configurable cells, so that the configurable cells are chained in a shift register (without the loop). The test mode is thus active.

The detection circuit 300 has the function of detecting the data present at the data outputs of a part of the configurable cells, and producing the authentication signal if, at the end of a time T1, the data are equal to a reference value.

In the example shown in FIG. 2, the detection circuit 300 has a comparator 310, a latch circuit 320 and a register 330. The comparator has Y1 (in the example shown Y1=4) one-bit data inputs, each connected to a data output of one of the cells 2k, 2l, 2m, 2n, and one Y1-bit data input connected to the register 330 in which a reference value is stored. A data output of the comparator is connected to a data input of the D type latch circuit also comprising a control input to which the signal EXTRACT is applied, and an output connected to the control input of the logic interconnection device.

The signal EXTRACT is produced by the control circuit CTAP, one time period T1 after the first activation of the signal SCAN_ENABLE. The time T1 corresponds to the loading time in the configurable cells of the identifier of the user. T1 is equal to p times the period of the signal CLK, with p being the size of the identifier.

In one variation, the circuit CTAP produces the signal EXTRACT during the first in the activation of the signal SCAN_ENABLE, which corresponds to the end of the loading of the identifier. By choice, the size of the identifier may be smaller or greater than the number of configurable cells 2a to 2z. The overall security of the circuit increases with the size of the identifier.

The detection circuit works as follows. The comparator 310 compares the content of the configurable cells 2k, 2l, 2m, 2n with a reference value and produces a signal that is active if the two values are equal or else inactive. When the latch circuit receives the signal EXTRACT, it transmits the signal produced by the comparator and keeps this signal at its output.

The general operation of the electronic circuit will now be described, in combination with the method according to the invention. Initially, all the signals TEST_MODE, SCAN_ENABLE, RESET, CLK, COM are inactive. To launch a test, a TEST_MODE signal to command passage into test mode must first of all be addressed to the control circuit CTAP.

At the first activation of the TEST_MODE signal, the circuit CTAP first of all produces an active RESET signal which will reset the content of all the configurable cells 2a to 2z, then produces the active SCAN_ENABLE signal which will control the multiplexers 21 appropriately to activate the test inputs of the configurable cells. Since the COM signal is inactive, the configurable cells are connected to the interconnection device to form a linear feedback shift register.

Then, by sending the propagation command signal CLK, the control circuit CTAP serially loads an identifier into the latches 22 of these configurable cells through the input SRI of the linear feedback shift register. The comparator 310 compares the content of the configurable cells with the reference value.

At the end of the time T1, the circuit CTAP produces the signal EXTRACT and, if the identifier is correct (i.e., if the content of the cells 2a to 2z is equal to be expected value stored in the register 330), the comparator 310 produces an active signal CON which the latch circuit 320 retransmits at its output. The signal COM remains inactive if the identifier is not correct.

The signal COM configures the multiplexers 212a, 212b, 212c so that the cells 2a to 2z are chained. The user is thus authenticated and the test mode is thus activated. Then, by sending the propagation control signal CLK, the control signal CTAP serially loads test data into the latch circuits 22 of the configurable cells through the input SRI of the linear feedback shift register.

Then, by deactivation of the chaining control signal SCAN_ENABLE, the control signal CTAP reconfigures the configurable cells 2a to 2z as a functional element of the logic circuit 100, and orders the execution of one or more cycles of the propagation signal CLK by this functional element, which processes the test data.

Through reactivation of the chaining command signal SCAN_ENABLE (the remaining COM signal remaining unchanged), the control circuit CTAP again reconfigures the configurable cells 2a to 2z as a shift register. Finally, by sending a propagation control signal CLK, the control circuit CTAP retrieves, at the output SRO of this register, the data stored in the latch circuits 22 and coming from the processing of the test data by the logic circuit 100. The signal SCAN_ENABLE 10 can then be deactivated and then reactivated at will without modification of the signal COM.

It must be noted that, in the electronic circuit, the configurable cells need to be reset before the identifier is input since the content of the cells before the input of the identifier modifies the content of the cells as and when the identifier is input. Consequently, a fraudulent individual who might try to introduce an identifier cannot hope to obtain a piece of information in return on a residual content of the cells before the identifier is input.

The example of FIG. 2 shows a variation of the electronic circuit in which the logic interconnection circuit is suited, when the signal COM is active, to forming a linear feedback shift register as follows. A device is formed in a loop with four configurable cells 2k, 2l, 2m and 2n and appropriate interconnection cells. The previous cells 2a to 2j (not represented on FIG. 2) are chained and connected to the output of the cells 2j to the data input of the looped device. The following cells 2o to 2z (not represented on FIG. 2) are chained and connected to the output of the looped device to the test input of the cell 2o. The detection circuit is suited to testing the content of the configurable cells of the looped device, and produces the authentication signal if the content is equal to an expected value.

However, it is possible to envisage several other approaches to making the interconnection circuit. For example, it is possible to use an interconnection circuit which is suited, when the signal COM is active, to forming a device in a loop with all the configurable cells 2a to 2z (in this case, the device in a loop directly forms the linear feedback shift register). However, this soon becomes difficult to implement, especially for circuits with a large number of configurable cells. The difficulty of making the logic interconnection circuit, and its size greatly increases with a number of configurable cells associated together in the loop device.

It is also possible to group together all the cells (or only a part of them) in packets of several adjacent cells and use an interconnection circuit suited to forming a device in a loop for each packet of cells, and set up a series association of the different looped devices thus formed to make the linear feedback shift register. In this case, provision is preferably made for one detection circuit for each packet of configurable cells. The packets may all comprise a same number of configurable cells but this is not indispensable. In one example of a circuit comprising a total of 1000 to 2000 configurable cells, the cells can be grouped together in 50-cell packets. This embodiment is preferable to the previous one because the logic interconnection circuit needed for making several looped devices comprising a smaller number of configurable cells is easier and less costly to make (especially in terms of silicon surface area) than an interconnection circuit needed for making a single looped device comprising on the whole the same number of configurable cells.

Figure 3:
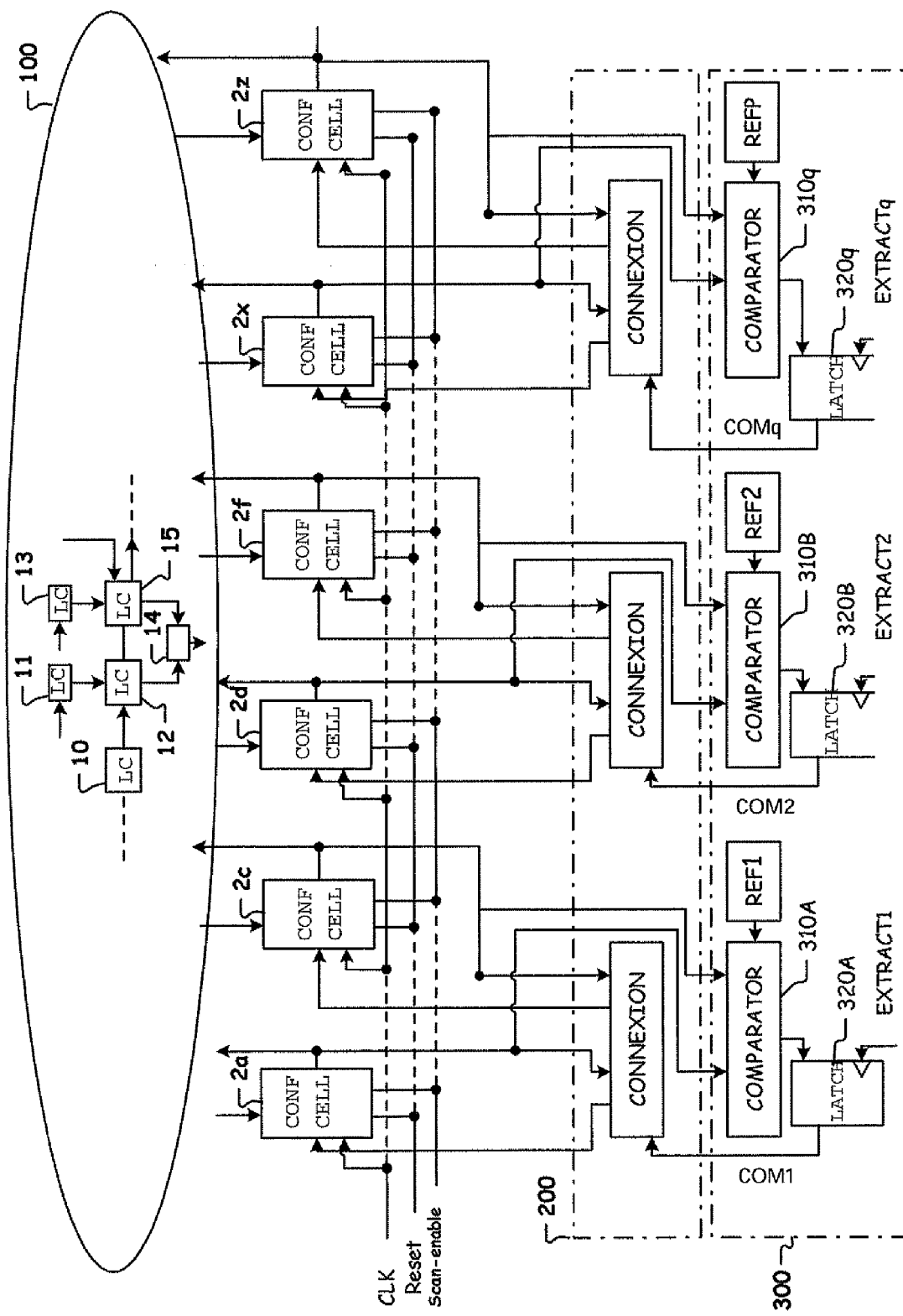
FIG. 3 is a drawing of a variation of the electronic circuit according to FIGS. 1 and 2.

One example of such an embodiment is shown in FIG. 3. The plurality of configurable cells 2a to 2z has been distributed into q packets of cells. The first packet comprises the cells 2a to 2c, the second packet comprises the cells 2d to 2f, . . . , and the qth packet comprises the cells 2x to 2z. Each packet of cells has an associated interconnection device 200a to 200q which, depending on a signal COMa to COMq, is suited to connecting the configurable cells of the associated packet either in a looped device or in a chain.

Each interconnection device 200a to 200q has an associated detection device 300a to 300q to detect the content of the configurable cells of the associated packet of cells when it receives a signal EXTRACTa, to EXTRACTq, compares it with an expected value REFa to REFq and produces the authentication signal COMa to COMq if, at the end of a period of time Ta to Tq (possibly periods of time Ta to Tq different from one another), the content of the detected cells is different from the expected associated value REFa to REFq.

The signals EXTRACTa to EXTRACTq are produced by the circuit CTAP from the signal SCAN_ENABLE. In a first variation, the signal EXTRACTa is produced one time period Ta after the first activation of the signal SCAN_ENABLE, the signal EXTRACTb is produced one time period Tb after the first activation of the signal SCAN_ENABLE, . . . the signal EXTRACTq is produced one time period Tq after the first activation of the signal SCAN_ENABLE, and with the time periods Ta, Tb, . . . Tq being increasing and the time periods TQ preferably corresponding to the end of the loading of the identifier into the configurable cells. The signal SCAN_ENABLE is in this case kept active throughout the identifier loading time. The extraction and modification of the content of the latch circuits is done in parallel. The extraction and modification of the content of the latches is preferably interrupted as soon as one of the signals COMa to COMq is not activated at the end of the associated period of time Ta to Tq.

In a second variation, at the end of the time period Ta after the first activation of the signal SCAN_ENABLE, the signal SCAN_ENABLE is deactivated and the signal EXTRACTa is produced, thus interrupting the loading of the identifier and activating the detection circuit 300a. Ta is chosen to be greater than or equal to the time of loading the beginning of the identifier in the first packet of configurable cells.

If the detection circuit 300a produces the active signal COMa, then the signal SCAN_ENABLE is reactivated (second activation) and loading of the identifier is resumed. At the end of a time period Tb after the second activation of SCAN_ENABLE, the signal SCAN_ENABLE is deactivated and the signal EXTRACTb is produced, thus interrupting the loading of the identifier and activating the detection circuit 300b. Tb is chosen to be greater than or equal to the time of loading of the beginning of the identifier in the second packet of configurable cells.

If the detection circuit 300b produces the active signal COMb, then the signal SCAN_ENABLE is reactivated (third activation) and the loading of the identifier is resumed. At the end of a time period Tq after the $(q-1)^{-th}$ activation of SCAN_ENABLE, the signal SCAN_ENABLE is deactivated and the signal EXTRACTq is produced, and the loading of the identifier is ended and detection circuit 300q is activated. Tq is chosen to be equal to the loading time for the last bits of the identifier in the configurable cells.

As shown in FIG. 3, each interconnection device 200a to 200q receives an authentication signal COMa to COMq produced by an associated detection device 300a to 300q. In a second variation (not shown), each interconnection device 200a to 200q receives several authentication signals COMa to COMq (possibly all the signals, but not necessarily so) and, depending on the signals that it receives, connects the configurable cells of the associated packet either in a looped device if at least one of the signals is inactive, or else in a chain.

A third variation (not shown) provides a way to combine the signals COMa to COMq, and produces a resultant inactive signal COM if at least one of the signals COMa to COMq is inactive, with the resulting signal COM being thus applied to all the detection devices. However, this variation is less secured than the previous variation inasmuch as the resulting signal CON is liable to undergo attack by micro-probing.

Other approaches can also be envisaged for making the detection circuit. For example, the detection circuit may be adapted to detecting the content of all the configurable cells including, if necessary, those that do not have a looped input.

Furthermore, the configurable cells involved in a looped device and the configurable cells whose content is detected are not obligatorily the same. In general, a circuit according to the invention comprises interconnection means or circuit to form a feedback register, comprising one or more looped devices being (each including several configurable cells) series-associated with, as the case may be, other configurable cells. The circuit preferably further comprises a means of detection to detect the content of all or part of the configurable cells and the end of a period of time T1 and produce an authentication signal if said content is equal to a reference value.

If the authentication signal is not active after the period of time T1, then the interconnection circuit does not authorize the chained association of the configurable cells. The test mode is not activated.

According to one variation, the signal COM (at the signals COMa to COMq) is/are also given to the control circuit CTAP which may prohibit the continuation of the loading of data into the configurable cells. To this end, the circuit CTAP may reset the configurable cells to erase their content and/or change the state of the control signal SCAN_ENABLE to reconfigure the cells in the standard mode of operation, and/or inhibit the data propagation signal CLK to place the circuit in a totally blocked state.

That which is claimed:

1. An electronic circuit comprising:
a plurality of logic cells;
a plurality of configurable cells being functionally linked to said plurality of logic cells for forming at least one logic circuit if a chaining command signal is in a first state; and
an interconnection circuit comprising a plurality of connection cells being functionally linked to said plurality of configurable cells if the chaining command signal is in a second state, each connection cell comprising
a first data input connected to a data output of one of said plurality of configurable cells,
a data output connected to a test input of another one of said plurality of configurable cells having a rank higher than a rank of the configurable cell connected to the first data input,
a second data input connected to the data output of the other configurable cell, and
a combination and connection circuit for performing the following functions if the chaining command signal is in the second state
combining the first and second data inputs, and applying a result of the combining to the data output if an authentication signal is in a first state, or
connecting the first data input to the data output if the authentication signal is in the second state.

2. An electronic circuit according to claim 1, wherein each combination and connection circuit comprises:
a logic gate comprising two inputs connected respectively to the first data input and to the second data input of the corresponding connection cell; and
a multiplexer comprising two inputs connected respectively to the first data input of the corresponding connection cell and to an output of said logic gate.

3. An electronic circuit according to claim 1, further comprising a detection circuit that activates, at least one period after a first activation of the chaining command signal, the authentication signal based on contents of a set of said plurality of configurable cells corresponding to a first reference value.

4. An electronic circuit according to claim 3, wherein said detection circuit comprises:
a comparator for comparing the contents of the set of said plurality of configurable cells with the first reference value, and activating the authentication signal based on the contents of the set of said plurality of configurable cells corresponding to the first reference value; and a validation circuit for transmitting the authentication signal to said interconnection circuit after the at least one time period.

5. An electronic circuit comprising:
a plurality of logic cells;
a plurality of configurable cells being functionally linked to said plurality of logic cells for forming at least one logic circuit if a chaining command signal is in a first state; and
an interconnection circuit comprising a plurality of connection cells being functionally linked to said plurality of configurable cells if the chaining command signal is in a second state, each connection cell comprising
 a first data input connected to a data output of one of said plurality of configurable cells,
 a data output connected to a test input of another one of said plurality of configurable cells having a rank higher than a rank of the configurable cell connected to the first data input,
 a second data input connected to the data output of yet another configurable cell having a rank higher than the rank of the next configurable cell, and
 a combination and connection circuit for performing the following functions if the chaining command signal is in the second state
  combining the first and second data inputs, and applying a result of the combining to the data output if an authentication signal is in a first state, or
  connecting the first data input to the data output if the authentication signal is in the second state.

6. An electronic circuit according to claim 5, wherein each combination and connection circuit comprises:
a logic gate comprising two inputs connected respectively to the first data input and to the second data input of the corresponding connection cell; and
a multiplexer comprising two inputs connected respectively to the first data input of the corresponding connection cell and to an output of said logic gate.

7. An electronic circuit according to claim 5, further comprising a detection circuit that activates, at least one period after a first activation of the chaining command signal, the authentication signal based on contents of a set of said plurality of configurable cells corresponding to a first reference value.

8. An electronic circuit according to claim 7, wherein said detection circuit comprises:
a comparator for comparing the contents of the set of said plurality of configurable cells with the first reference value, and activating the authentication signal based on the contents of the set of said plurality of configurable cells corresponding to the first reference value; and
a validation circuit for transmitting the authentication signal to said interconnection circuit after the at least one time period.

9. An electronic circuit according to claim 5, wherein said plurality of configurable cells is subdivided into a plurality of packets of configurable cells; and wherein said plurality of connection cells is divided into a plurality of packets of connection cells associated with said plurality of packets of configurable cells to form a plurality of looped registers series-associated to form a linear feedback shift register based on the authentication signal being in the first state.

10. An electronic circuit according to claim 9, further comprising a plurality of detection circuits, each detection circuit associated with a packet of configurable cells and with a packet of connection cells, and each detection circuit being laid out for the activation, at least one time period after a first activation of the chaining command signal, of the authentication signal based on contents of the associated packet of configurable cells corresponding to an associated reference value.

11. A method for operating an electronic circuit comprising a plurality of logic cells; a plurality of configurable cells; and an interconnection circuit comprising a plurality of connection cells being functionally linked to the plurality of configurable cells if the chaining command signal is in a second state, each connection cell comprising a first data input connected to a data output of one of the plurality of configurable cells, a data output connected to a test input of a next one of the plurality of configurable cells having a rank higher than a rank of the configurable cell connected to the first data input, a second data input connected to the data output of the next configurable cell, and a combination and connection circuit, the method comprising:
functionally linking the plurality of configurable cells to the plurality of logic cells for forming at least one logic circuit if a chaining command signal is in a first state; and
operating each connection cell for performing the following functions if the chaining command signal is in the second state
 combining the first and second data inputs, and applying a result of the combining to the data output if an authentication signal is in a first state, or
 connecting the first data input to the data output if the authentication signal is in the second state.

12. A method according to claim 11, wherein each combination and connection circuit comprises a logic gate comprising two inputs connected respectively to the first data input and to the second data input of the corresponding connection cell; and a multiplexer comprising two inputs connected respectively to the first data input of the corresponding connection cell and to an output of the logic gate.

13. A method according to claim 11, wherein the electronic circuit further comprises a detection circuit that activates, at least one period after a first activation of the chaining command signal, the authentication signal based on contents of a set of the plurality of configurable cells corresponding to a first reference value.

14. A method according to claim 13, wherein the detection circuit comprises:
a comparator for comparing the contents of the set of the plurality of configurable cells with the first reference value, and activating the authentication signal based on the contents of the set of the plurality of configurable cells corresponding to the first reference value; and
a validation circuit for transmitting the authentication signal to the interconnection circuit after the at least one time period.

15. A method for operating an electronic circuit comprising a plurality of logic cells; a plurality of configurable cells; and an interconnection circuit comprising a plurality of connection cells being functionally linked to the plurality of configurable cells if the chaining command signal is in a second state, each connection cell comprising a first data input connected to a data output of one of the plurality of configurable cells, a data output connected to a test input of a next one of the plurality of configurable cells having a rank higher than a rank of the configurable cell connected to the first data input, a second data input connected to the data output of another configurable cell having a rank higher than the rank of the next configurable cell, and a combination and connection circuit, the method comprising:

functionally linking the plurality of configurable cells to the plurality of logic cells for forming at least one logic circuit if a chaining command signal is in a first state; and operating each combination and connection circuit for performing the following functions if the chaining command signal is in the second state combining the first and second data inputs, and applying a result of the combining to the data output if an authentication signal is in a first state, or connecting the first data input to the data output if the authentication signal is in the second state.

16. A method according to claim 15, wherein each combination and connection circuit comprises a logic gate comprising two inputs connected respectively to the first data input and to the second data input of the corresponding connection cell; and a multiplexer comprising two inputs connected respectively to the first data input of the corresponding connection cell and to an output of the logic gate.

17. A method according to claim 15, wherein the electronic circuit further comprises a detection circuit that activates, at least one period after a first activation of the chaining command signal, the authentication signal based on contents of a set of the plurality of configurable cells corresponding to a first reference value.

18. A method according to claim 17, wherein the detection circuit comprises:

a comparator for comparing the contents of the set of the plurality of configurable cells with the first reference value, and activating the authentication signal based on the contents of the set of the plurality of configurable cells corresponding to the first reference value; and a validation circuit for transmitting the authentication signal to the interconnection circuit after the at least one time period.

19. A method according to claim 15, wherein the plurality of configurable cells is subdivided into a plurality of packets of configurable cells; and wherein the plurality of connection cells is divided into a plurality of packets of connection cells associated with the plurality of packets of configurable cells to form a plurality of looped registers series-associated to form a linear feedback shift register based on the authentication signal being in the first state.

20. A method according to claim 19, wherein the electronic circuit further comprises a plurality of detection circuits, each detection circuit associated with a packet of configurable cells and with a packet of connection cells, and each detection circuit being laid out for the activation, at least one time period after a first activation of the chaining command signal, of the authentication signal based on contents of the associated packet of configurable cells corresponding to an associated reference value.

21. A method for testing an electronic circuit comprising a plurality of configurable cells configured as a function of a chaining command signal and an authentication signal, the method comprising:

if the chaining command signal is in a first state, then the electronic circuit is in a functional state in which the plurality of configurable cells is functionally connected to logic cells with which they cooperate to form at least one logic circuit;

if the chaining command signal is in a second state, and if the authentication signal is in a first state, then the electronic circuit is in a looped state wherein the plurality of configurable cells is functionally linked to interconnection cells to form a linear feedback shift register, and the following are performed inputting an identifier into the plurality of configurable cells functionally forming the linear feedback shift register, verifying contents of the plurality of configurable cells, activating the authentication signal if, at an end of a predefined time period, the contents are equal to an expected value, and if the authentication signal is in a second state, then the electronic circuit is in a chained state wherein the plurality of configurable cells is functionally connected in a chain to form a shift register.

22. A method according to claim 21, further comprising resetting the contents of the plurality of configurable cells.

* * * * *

UNITED STATES PATENT AND TRADEMARK OFFICE
CERTIFICATE OF CORRECTION

| | | |
|---|---|---|
| PATENT NO. | : 7,921,342 B2 | Page 1 of 1 |
| APPLICATION NO. | : 11/675265 | |
| DATED | : April 5, 2011 | |
| INVENTOR(S) | : Bancel et al. | |

It is certified that error appears in the above-identified patent and that said Letters Patent is hereby corrected as shown below:

Column 2, Line 54   Delete: "register"
Insert: --register.--

Column 3, Line 54   Delete: "To"
Insert: --The--

Column 5, Line 9    Delete: "so that"

Column 6, Line 18   Delete: "cells"
Insert: --cell--

Column 6, Line 19   Delete: "CON"
Insert: --COM--

Column 7, Line 32   Delete: "be"
Insert: --the--

Column 7, Line 34   Delete: "CON"
Insert: --COM--

Column 9, Line 55   Delete: "CON"
Insert: --COM--

Signed and Sealed this
Ninth Day of August, 2011

David J. Kappos
*Director of the United States Patent and Trademark Office*